US012631475B2

(12) United States Patent
Suess et al.

(10) Patent No.: US 12,631,475 B2
(45) Date of Patent: May 19, 2026

(54) DEVICES FOR DETERMINING A NUMBER OF ROTATIONS OF A MAGNETIC FIELD

(71) Applicant: Infineon Technologies AG, Neubiberg (DE)

(72) Inventors: Dieter Suess, Herzogenburg (AT); Johannes Guettinger, Lind ob Velden (AT); Armin Satz, Villach (AT)

(73) Assignee: Infineon Technologies AG, Neubiberg (DE)

( * ) Notice: Subject to any disclaimer, the term of this patent is extended or adjusted under 35 U.S.C. 154(b) by 260 days.

(21) Appl. No.: 18/602,584

(22) Filed: Mar. 12, 2024

(65) Prior Publication Data

US 2024/0310190 A1     Sep. 19, 2024

(30) Foreign Application Priority Data

Mar. 16, 2023     (DE) .......................... 102023106611.0

(51) Int. Cl.
| | |
|---|---|
| G01D 5/16 | (2006.01) |
| H10N 50/01 | (2023.01) |
| H10N 50/10 | (2023.01) |

(52) U.S. Cl.
CPC .............. G01D 5/16 (2013.01); H10N 50/01 (2023.02); H10N 50/10 (2023.02)

(58) Field of Classification Search
CPC .............................. G01R 33/02; G01R 33/06; G01R 33/09–098; G01R 33/1284; G11C 11/16; G11C 11/161; G01D 5/12; G01D 5/14; G01D 5/142; G01D 5/16; G01D 5/244; G01D 5/245; H10N 50/00; H10N 50/01; H10N 50/10; H10N 50/80
See application file for complete search history.

(56) References Cited

U.S. PATENT DOCUMENTS

| | | | |
|---|---|---|---|
| 3,534,347 A | 10/1970 | Bobeck | |
| 4,990,909 A | 2/1991 | Ueda et al. | |
| 10,541,074 B2 * | 1/2020 | Büttner ................. | H01F 10/329 |
| 2011/0261602 A1 * | 10/2011 | Moutafis ............ | G11C 19/0866 |
| | | | 365/7 |
| 2017/0178746 A1 * | 6/2017 | Nagaosa ............. | G11C 11/1675 |
| 2017/0179375 A1 * | 6/2017 | Nagaosa ................ | H10D 48/40 |
| 2017/0256351 A1 * | 9/2017 | Cros ...................... | H10N 50/80 |
| 2019/0304653 A1 | 10/2019 | Oguz et al. | |
| 2020/0006628 A1 * | 1/2020 | O'Brien .............. | G11C 11/1675 |

FOREIGN PATENT DOCUMENTS

| | | | |
|---|---|---|---|
| JP | S6375619 A | | 4/1988 |
| JP | 2021033579 A | * | 3/2021 |

* cited by examiner

*Primary Examiner* — Huy Q Phan
*Assistant Examiner* — David B Frederiksen
(74) *Attorney, Agent, or Firm* — Harrity & Harrity, LLP

(57) ABSTRACT

A device includes a magnetic layer and a guiding structure arranged over the magnetic layer and configured to sequentially transfer a skyrmion in the magnetic layer along a transfer pattern in response to a rotating magnetic field. The device further includes a plurality of magnetoresistive elements arranged along the transfer pattern and configured to detect a position of the skyrmion in the transfer pattern. The device is configured to determine a number of rotations of the rotating magnetic field based on the detected position of the skyrmion in the transfer pattern.

22 Claims, 4 Drawing Sheets

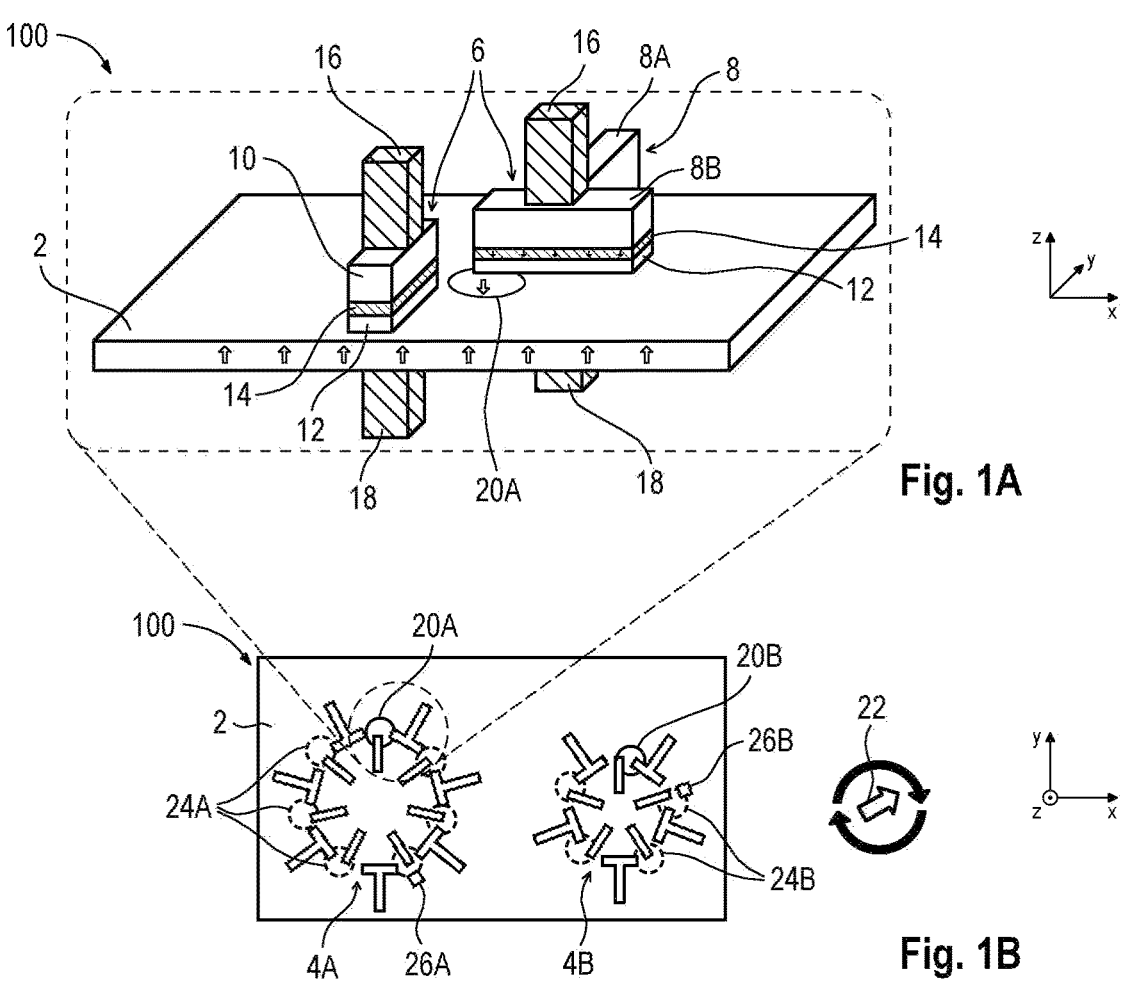
Fig. 1A
Fig. 1B
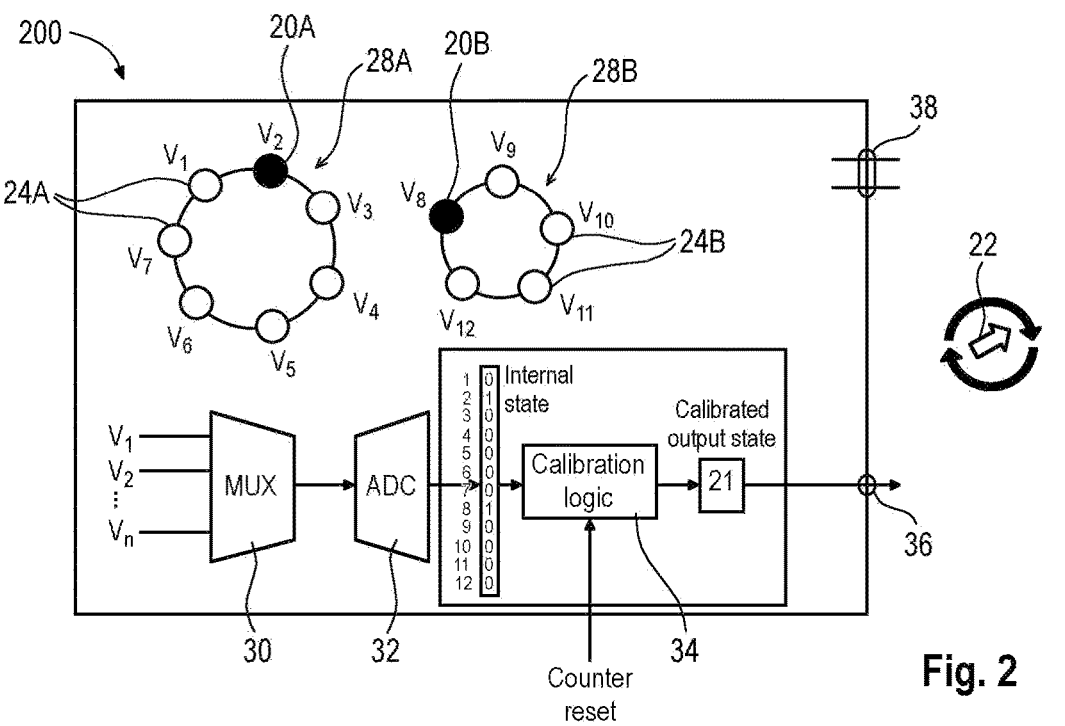
Fig. 2

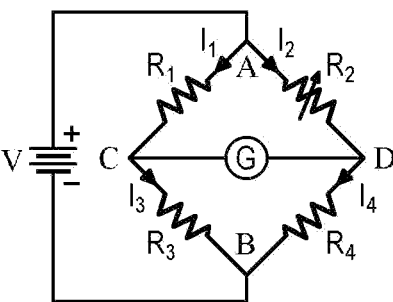

Fig. 6B

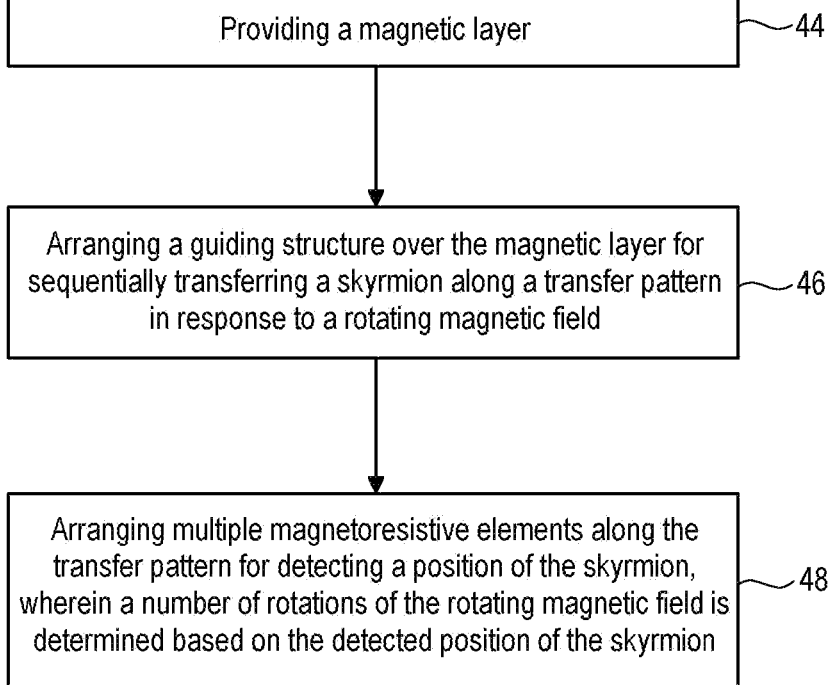

| | |
|---|---|
| Providing a magnetic layer | ⌐44 |

| | |
|---|---|
| Arranging a guiding structure over the magnetic layer for sequentially transferring a skyrmion along a transfer pattern in response to a rotating magnetic field | ⌐46 |

| | |
|---|---|
| Arranging multiple magnetoresistive elements along the transfer pattern for detecting a position of the skyrmion, wherein a number of rotations of the rotating magnetic field is determined based on the detected position of the skyrmion | ⌐48 |

Fig. 7

DEVICES FOR DETERMINING A NUMBER OF ROTATIONS OF A MAGNETIC FIELD

CROSS-REFERENCE TO RELATED APPLICATION

This application claims priority to German Patent Application No. 102023106611.0 filed on Mar. 16, 2023, the content of which is incorporated by reference herein in its entirety.

TECHNICAL FIELD

The present disclosure relates to devices for determining a number of rotations of a magnetic field. In addition, the present disclosure relates to methods for fabricating such devices.

BACKGROUND

In many technical applications reliable information about a number of rotations performed by a component of the application may be required. For example, information about a rotation number may be required for position encoders used in automotive applications. The position encoders may be used for encoding the position of steering wheels, seat belts, clutch actuators, wheels, damping system motors, etc. Manufacturers and designers of multiturn counters are constantly striving to improve their products. In particular, it may be desirable to provide compact and cost effective devices with low energy consumption as well as suitable methods for fabricating the devices.

SUMMARY

An aspect of the present disclosure relates to a device. The device includes a magnetic layer and a guiding structure arranged over the magnetic layer and configured to sequentially transfer a skyrmion in the magnetic layer along a transfer pattern in response to a rotating magnetic field. The device further includes a plurality of magnetoresistive elements arranged along the transfer pattern and configured to detect a position of the skyrmion in the transfer pattern. The device is configured to determine a number of rotations of the rotating magnetic field based on the detected position of the skyrmion in the transfer pattern.

A further aspect of the present disclosure relates to a method for fabricating a device. The method includes an act of providing a magnetic layer and an act of arranging a guiding structure over the magnetic layer, wherein the guiding structure is configured to sequentially transfer a skyrmion in the magnetic layer along a transfer pattern in response to a rotating magnetic field. The method further includes an act of arranging a plurality of magnetoresistive elements along the transfer pattern, wherein the magnetoresistive elements are configured to detect a position of the skyrmion in the transfer pattern. The fabricated device is configured to determine a number of rotations of the rotating magnetic field based on the detected position of the skyrmion in the transfer pattern.

BRIEF DESCRIPTION OF THE DRAWINGS

Devices and methods in accordance with the disclosure will be explained in more detail below based on the drawings. The elements of the drawings are not necessarily to scale relative to each other. Similar reference signs may designate corresponding similar parts.

FIGS. 1A and 1B schematically illustrate a perspective view and a top view of a device 100 in accordance with the disclosure.

FIG. 2 schematically illustrates a device 200 in accordance with the disclosure.

FIGS. 6A and 6B schematically illustrate a device 600 in accordance with the disclosure and a Wheatstone bridge circuit that may be used in the device 600.

FIG. 7 illustrates a flowchart of a method for fabricating a device in accordance with the disclosure.

DETAILED DESCRIPTION

Figure 3:
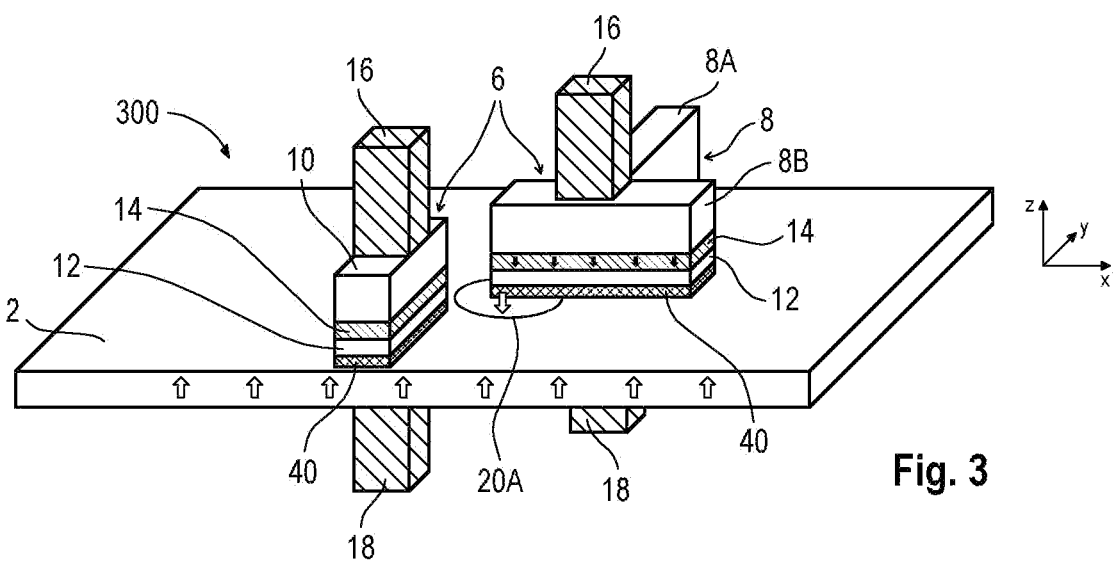
FIG. 3 schematically illustrates a perspective view of a device 300 in accordance with the disclosure.

The device 100 of FIG. 1 may include a magnetic layer 2, a guiding structure 4A arranged over the magnetic layer 2 and a plurality of magnetoresistive elements 6. For example, the magnetic layer 2 may consist of a magnetic multilayer. The guiding structure 4A may include a plurality of T-shaped soft magnetic components 8 and a plurality of I-shaped soft magnetic components 10. The magnetoresistive elements 6 may include a layer stack including magnetic layer 2, an intermediate layer 12 and a reference layer 14. In addition, the layer stack may include a T-shaped soft magnetic component 8 or an I-shaped soft magnetic component 10. The individual magnetoresistive elements 6 may be electrically connected to a top contact 16 and a bottom contact 18.

The components 8 and 10 of the guiding structure 4A may include or may be made of a soft magnetic material. As can be seen from the top view of FIG. 1B, the T-shaped components 8 and the I-shaped components 10 may be arranged alternately. Each T-shaped component 8 may be formed by a first portion 8A and a second portion 8B that may be arranged substantially perpendicular to each other. In the non-limiting illustrated example, the first portion 8A may be longer than the second portion 8B. The components 8 and 10 of the guiding structure 4A may be arranged to form a closed loop. In the illustrated example, the closed loop may have the shape of a circle. The first portions 8A of the T-shaped components 8 and the I-shaped components 10 may be arranged in a radial direction of the circle. The second portions 8B of the T-shaped components 8 may be arranged in a tangential direction of the circle.

The guiding structure 4A may be configured to sequentially transfer a skyrmion 20A in the magnetic layer 2 in response to a rotating magnetic field 22. As used herein, the terms "skyrmion" and "magnetic skyrmion" may be interchangeably used. A skyrmion may include at least one of a skyrmion state or a trivial bubble state. In other words, the term "skyrmion" as used herein may refer to skyrmion states and/or trivial bubble states. A skyrmion state may correspond to a topologically non-trivial skyrmion having a non-zero skyrmion number (or a non-zero topological charge). A trivial bubble state may correspond to a topologically trivial magnetic bubble having a skyrmion number (or a topological charge) of zero. The skyrmion 20A is illustrated by a circle and an arrow indicating a magnetization of the skyrmion 20A. In the illustrated example, the skyrmion 20A may have a magnetization pointing in the (e.g., negative) z-direction.

In some examples, the magnetic layer 2 may consist of materials with Dzyaloshinskii-Moriya interaction (DMI) that favors the formation of magnetic skyrmions. Examples are magnetic multilayers, with layer stacks such as [heavy metal layer 1/magnetic layer/non-magnetic layer]$_x$ where N is the repetition number of the multilayer. Due to the break of symmetry since two different layers are used adjacent to the magnetic layer DMI may occur. The heavy metal layer may be any material such as e.g., Pt, Ti, Ta, W, Hf, Pd. The non-magnetic layer may be a heavy metal layer or an isolator such as e.g., AlO, MgO. The magnetic layer may be any alloy containing, Co, Fe or Ni. Examples are CoFeB, CoFe, CoNi. In other examples, the magnetic layer 2 may consist only of heavy metal layer 1/magnetic layer.

The transfer of the skyrmion 20A in the magnetic layer 2 may be along a transfer pattern and may be effected by a magnetization of the guiding structure 4A. The magnetization of the guiding structure 4A may be generated by the rotating magnetic field 22. The magnetic layer 2 and the rotation plane of the magnetic field 22 may be arranged parallel to each other, such as e.g., in the x-y-plane. The form or shape of the transfer pattern may depend on the relative arrangement of the T-shaped components 8 and I-shaped components 10. In the illustrated example, the transfer pattern may form a closed loop or circle as previously discussed. Multiple positions 24A may be arranged along the transfer pattern. The skyrmion 20A may sequentially pass through the positions 24A during multiple rotations of the magnetic field 22.

During its rotation the magnetic field 22 may continuously change a magnetization of the guiding structure 4A. Depending on the current position of the rotating magnetic field 22, the portions 8A, 8B of the T-shaped components 8 and the I-shaped components 10 may be magnetized or not. For example, if the magnetic field 22 is parallel to an I-shaped component 10 (or more particular parallel to its longitudinal side), the I-shaped component 10 may substantially form a magnetic dipole. Same considerations apply for the portions 8A and 8B of the T-shaped components 8. The magnetic poles of the soft magnetic components 8 and 10 may change with the rotation of the magnetic field 22 and may attract and/or repulse the skyrmion 20A. The soft magnetic guiding structure 4A may produce a magnetic stray field that may act on the magnetic layer 2 and the skyrmion 20A located therein.

Due to the discussed attraction and/or repulsion of the skyrmion 20A it may be transferred along the transfer pattern in the magnetic layer 2 below the guiding structure 4A. With each rotation of the magnetic field 22, the skyrmion 20A may propagate to the next neighboring components 8 and 10, thereby following the potential energy minimum due to the stray field of the guiding structure 4A. During one full rotation of the magnetic field 22 the skyrmion 20A may be transferred from a position 24A to the next neighboring position 24A. In the top view of FIG. 1B, the positions 24A are indicated by small dashed circles. For example, each of the positions 24A may be substantially arranged between a tip of an I-shaped component 10 and a tip of a second portion 8B of a T-shaped component 8. During N1 consecutive rotations of the magnetic field 22, the skyrmion 20A may be sequentially transferred along N1 positions 24A on the transfer pattern. After the N1 consecutive rotations of the magnetic field 22, the skyrmion 20A may again reach a same position 24A on the transfer pattern.

In other words, the skyrmion 20A start on one position 24A, and return to this same position 24A on the transfer pattern after the N1 consecutive rotations. In the non-limiting example of FIG. 1, N1 may have a value of seven.

It is to be noted that the geometric shape of the guiding structure 4A as shown in FIG. 1 is example and may be adapted or replaced by suitable other geometries. Various shapes of the guiding structure 4A may be used for providing a suitable sequential transfer of the skyrmion 20A in the magnetic layer 2 in response to the rotating magnetic field 22. In further examples, the guiding structure 4A may include or may be formed by at least one of V-shaped soft magnetic components or C-shaped soft magnetic components. Generally speaking, the geometric shape of the guiding structure 4A may be arbitrarily chosen as long as a magnetization of the guiding structure 4A generated by the rotating magnetic field 22 is configured to transfer the skyrmion 20A along the transfer pattern.

FIG. 1A shows an example structure of two magnetoresistive elements 6. The other magnetoresistive elements 6 of the device 100 may be configured in a similar fashion. Each of the magnetoresistive elements 6 may include a layer stack including the magnetic layer 2, an intermediate layer 12, a reference layer 14 and one of the soft magnetic components 8 and 10. In the illustrated example, the magnetoresistive elements 6 may e.g., correspond to tunnel magnetoresistive (TMR) elements, wherein the intermediate layer 12 may include or may be a tunnel barrier layer. For example, a tunnel barrier layer may include or may be made of magnesium oxide (MgO). In a further example, the magnetoresistive elements 6 may correspond to giant magnetoresistive (GMR) elements, wherein the intermediate layer 12 may include or may be a spacer layer. For example, a spacer layer may include or may be made of copper. The magnetic layer 2 may act as a free layer of the magnetoresistive element 6, and the reference layer 14 may act as a pinned layer of the magnetoresistive element 6. Yet other magnetoresistive element realizations may be based on the anisotropic magnetoresistance (AMR) effect or anomalous Hall effect. Each of the magnetic layer 2 and the reference layer 14 may include or may be made of a ferromagnetic material. In the illustrated example, the magnetoresistive elements 6 may correspond to current-perpendicular-to-plane (CPP) magnetoresistive elements. Here, currents may flow in a direction substantially perpendicular to the layer stack, e.g., in the z-direction.

A fabrication of the layer stack of the magnetoresistive element 6 may be based on a sputtering technique. The intermediate layer 12 may be sputtered on top of the magnetic layer 2. In a similar fashion, the reference layer 14 may be sputtered on top of the intermediate layer 12. Here, at least one of the intermediate layer 12 and the reference layer 14 may be applied over large areas at first. Afterwards, the magnetoresistive junctions may be structured based on a pillar patterning technique. The pillar patterning process may include an act of etching the sputtered material stack, wherein the etching act may need to be stopped in a controlled manner on the magnetic layer 2.

The plurality of magnetoresistive elements 6 may be arranged along the transfer pattern and may be configured to detect a position of the skyrmion 20A that is sequentially transferred as discussed above. In particular, the magnetoresistive elements 6 may be arranged at the N1 positions 24A along the transfer pattern. In the illustrated example, a first set of N1 magnetoresistive elements 6 may be arranged at the T-shaped components 8, and a second set of N1 magnetoresistive elements 6 may be arranged at the I-shaped components 10.

Each of the magnetoresistive elements 6 may be configured to provide a measurement value, such as e.g., a measured voltage. The measurement value of a magnetoresistive element 6 at a position 24A may depend on whether the skyrmion 20A is located at this position 24A or not. In a first example, each of the first set of N1 magnetoresistive elements 6 arranged at the T-shaped components 8 may provide a measured voltage value. The magnetoresistive element 6 under which the skyrmion 20A is located may e.g., provide a non-zero output value while the other magnetoresistive elements 6 may e.g., provide a zero output value. In a second example, each of the first set of N1 magnetoresistive elements 6 arranged at the T-shaped components 8 as well as each of the second set of N1 magnetoresistive elements 6 arranged at the I-shaped components 10 may provide a measured voltage value. If two adjacent magnetoresistive elements 6 provide a non-zero output value it may be determined that the skyrmion 20A is located between these components. Based on the measurement values provided by the magnetoresistive elements 6, the device 100 may be configured to determine a number of rotations of the rotating magnetic field 22 as will be discussed in more detail below in connection with FIG. 2. For example, the device 100 may include a processing circuit that receives the measurement values provided by the magnetoresistive elements 6, and determines the position of the skyrmion 20A based on the measurement values, and determines the number of rotations of the rotating magnetic field 22 based on the position of the skyrmion 20A (e.g., based on a detected position of the skyrmion 20A).

The device 100 or a component thereof may be configured to generate a bias magnetic field in a direction perpendicular to the magnetic layer 2, e.g., in the z-direction. Alternatively, the bias magnetic field may be generated by a component external to the device 100. In one example, the bias magnetic field may be generated by a polymer bonded magnet. Polymer bonded magnets may be formed by composite materials consisting of a polymeric matrix with embedded magnetic filler particles. The components of the device 100 may be at least partially encapsulated in a package or housing. For example, the package or housing may be at least partially formed by the polymer bonded magnet that generates the bias magnetic field.

The bias magnetic field may provide an operating field of the device 100 and may be configured to magnetize the magnetic layer 2 in the (e.g., positive) z-direction. In FIG. 1A, a magnetization of the magnetic layer 2 is indicated by multiple small arrows pointing in the positive z-direction. The magnetization of the skyrmion 20A may be anti-parallel to the direction of the bias magnetic field and the magnetization of the magnetic layer 2. That is, the skyrmion 20A may be transferred through the magnetic layer 2 along the transfer pattern with an anti-parallel magnetization.

The device 100 may include one or multiple components 26A configured to generate a skyrmion and to feed (or inject) the generated skyrmion into the transfer pattern. In particular, the component 26A may be configured to generate (or write) a skyrmion 20A in the magnetic layer 2, wherein the skyrmion 20A may be generated out of the saturated and biased state of magnetic layer 2. In the illustrated example, the component 26A may include or may correspond to a (spin orbit torque) magnetoresistive element that may be at least partially similar to previously discussed magnetoresistive elements 6. By providing a suitable (spin) current through the magnetic layer 2 in a perpendicular direction, a state in the magnetic layer 2 may be flipped based on a spin orbit torque effect. This may generate a skyrmion 20A having a magnetic moment anti-parallel to the magnetization of the magnetic layer 2. Alternatively, or additionally, the component 26A may include a conductive loop (or current loop) configured for generating (or writing) skyrmions. In particular, such loop may correspond to a hairpin-shaped loop made of a conductive material. A current pulse may be applied to the loop and a skyrmion may be generated, if the current pulse is strong enough to counteract the bias magnetic field.

The device 100 or a component thereof may be configured to remove one or multiple skyrmions from the magnetic layer 2 based on a spin orbit torque effect. In contrast to creating a skyrmion in the magnetic layer 2 as previously discussed, a spin orbit torque effect may also be used to remove any existing skyrmions in the magnetic layer and reset the device 100. In some examples, this may be realized by applying a current in plane within the magnetic layer 2. Due to spin orbit torque and/or spin transfer torque the magnetic skyrmions may be moved out of the device.

Besides the guiding structure 4A the device 100 may include one or multiple further guiding structures 4B. In the illustrated case, the device 100 may exemplarily include one further guiding structure 4B. The additional guiding structure(s) 4B may be at least partially similar to the guiding structure 4A such that all previously made comments may also hold true for the further guiding structure 4B. In the illustrated example, the further guiding structure 4B may have a plurality of T-shaped components 8 and I-shaped components 10. The further guiding structure 4B may be configured to sequentially transfer a further skyrmion 20B in the magnetic layer 2 along a further transfer pattern in response to the rotating magnetic field 22. One or multiple components 26B may be configured to generate a skyrmion and to feed (or inject) the generated skyrmion into the further transfer pattern.

A further plurality of magnetoresistive elements 6 may be arranged along the further transfer pattern and may be configured to detect a position of the further skyrmion 20B in the magnetic layer 2. During N2 consecutive rotations of the magnetic field 22, the further skyrmion 20B may be sequentially transferred along N2 positions 24B (see small dashed circles) along the further transfer pattern. After the N2 consecutive rotations of the rotating magnetic field 22, the further skyrmion 20B may again reach a same position on the further transfer pattern. In the non-limiting example of FIG. 1, N2 may have a value of five. In particular, the number N1 associated with the first transfer pattern and the number N2 associated with the second transfer pattern may be coprime numbers (integers) as will be further discussed later on in connection with FIG. 2.

The device 100 may be configured to determine the number of rotations of the rotating magnetic field 22 based on the detected position of one or more of the skyrmions 20A and 20B in the respective transfer pattern. In particular, the device 100 may be configured to determine the number of rotations of the rotating magnetic field 22 based on the measurement values provided by the magnetoresistive elements 6. A detection of the rotation number will now be described in connection with FIG. 2.

The device 200 of FIG. 2 may include some or all features of the device 100 of FIG. 1. The device 200 may include a transfer pattern 28A including a number of N1 (here: N1=7) positions 24A along which a skyrmion 20A may be transferred as discussed in connection with FIG. 1. In a similar fashion, a further skyrmion 20B may be transferred along a further transfer pattern 28B including a number of N2 (here: N2=5) positions 24B. For the sake of simplicity, the guiding structures and magnetoresistive elements of the device 200 are not explicitly illustrated. The device 200 may further include a multiplexer 30, an analog-digital converter 32 and a calibration logic 34. Furthermore, the device 200 may include a readout interface 36 and an electrical supply (and communication) interface 38 for powering the readout of the state, analog calibration and communication with external units (not illustrated).

During an operation of the device 200 a rotation of a magnetic field 22 may effect a sequential transfer of the skyrmion 20A along the transfer pattern 28A. In particular, for each full rotation of the magnetic field 22 the skyrmion 20A will move from its current position to one of its neighboring positions depending on the rotational direction of the magnetic field 22. For example, the transfer of the skyrmion 20A along the transfer pattern 28A and the rotational direction of the magnetic field 22 may both be clockwise. Reversing the rotational direction of the magnetic field 22 may result in a counterclockwise movement of the skyrmion 20A. In a similar fashion, the rotation of the magnetic field 22 may effect a sequential transfer of the further skyrmion 20B along the further transfer pattern 28B.

The device 200 may optionally include an angle sensor (not illustrated) such that not only the number of rotations can be counted, but the actual field angle of the applied rotated field 22. Possible angle sensors may be realized by GMR, TMR, AMR or Hall sensors.

At any required time magnetoresistive elements of the device 200 may provide a plurality of measurement values, such as e.g., a plurality of measured voltage values (or associated voltage signals). In the illustrated example, voltage values $V_1$ to $V_7$ may be provided for the positions 24A of the transfer pattern 28A while voltage values $V_8$ to $V_{12}$ may be provided for the positions 24B of the further transfer pattern 28B. In one example, the voltage values may be based on measurements performed by the magnetoresistive elements 6 arranged at the T-shaped components 8. In a further example, the voltage values may be based on measurements performed by the magnetoresistive elements 6 arranged at the T-shaped components 8 and the magnetoresistive elements 6 arranged at the I-shaped components 10. In the illustrated example, the voltage values $V_2$ and $V_8$ may be e.g., non-zero due to the presence of the skyrmions 20A and 20B at the respective positions. All further voltage values may take a value of e.g., zero.

The multiplexer 30 may be configured to receive the measured voltage values $V_1$ to $V_{12}$ and to output a serial signal based on the received values. The analog-digital converter 32 may receive the serial signal from the multiplexer 30 and convert the received signal to a digital signal. The digital signal output by the analog-digital converter 32 may be a binary state uniquely associated with the positions of the skyrmions 20A and 20B in the transfer patterns 28A and 28B. In the illustrated example, the non-zero voltage values $V_2$ and $V_8$ may result in a binary state [0 1 0 0 0 0 0 1 0 0 0 0] including a value of one at its second and eighth position and zero values otherwise. The calibration logic 34 may be configured to map the binary state to a calibrated output state. The calibrated output state may be readout by an external component (not illustrated) at the readout interface 36. Based on the read output state the external component may then uniquely determine the positions of the skyrmions 20A and 20B in the transfer patterns 28A and 28B. The device 200 may have been calibrated during a calibration procedure in which the calibration unit 34 may have uniquely mapped each possible combination of skyrmion positions in the transfer patterns (e.g., each associated possible binary state) to a calibrated output state.

Based on the discussed features of the device 200, a number of rotations of the magnetic field 22 (and also an associated rotation number of a component) may be determined. The rotating magnetic field 22 may be generated by a rotation of a magnet (not illustrated). The magnet may be mechanically coupled to a component (not illustrated) such that a rotation of the magnet and thus a rotation of the magnetic field 22 may be based on a rotational movement of the component. In non-limiting examples, the component may correspond to or may be associated with a component of an automotive application, a steering wheel, a seat belt, a seat belt tensioner, a clutch actuator, a wheel, a damping system motor, a component of an elevator, etc. Devices in accordance with the disclosure may be configured to determine a number of rotations of the rotating magnetic field 22 and thus a number of rotations performed by the magnet or the component coupled thereto.

In one example, a neutral position of a component (such as e.g., a wheel or a steering wheel) may be associated with the skyrmion 20A being located at the first position in the transfer pattern 28A and the further skyrmion 20B being located at the eighth position in the further transfer pattern 28B. Here, the voltage values $V_1$ and $V_8$ may be non-zero such that the neutral position of the component may be uniquely associated with the binary state [1 0 0 0 0 0 0 1 0 0 0 0] having a value of one at the first and eighth position.

Turning the component (e.g., clockwise) for e.g., a full rotation may result in a full rotation of the magnetic field 22, wherein the skyrmions 20A and 20B may be transferred to their next neighboring positions. A measurement of the magnetoresistive elements may then provide non-zero voltage values $V_2$ and $V_9$ such that a number of one rotation of the magnetic field 22 may be uniquely associated with the binary state [0 1 0 0 0 0 0 0 1 0 0 0] having values of one at the second and ninth position. In a similar fashion, each further rotation number may be uniquely associated with a binary state determined by a simultaneous measurement of the magnetoresistive elements of the device 200.

A calibrated output state may thus indicate the number of rotations that has been performed by the magnetic field 22. Based on the output state the position of the rotating component may be uniquely determined. In particular, N1 and N2 may be coprime numbers. In this case, the device 200 may be configured to distinguish a total number $N_{total}$ of N1 times N2 rotations (here: $N_{total}$=N1·N2 32 7·5=35). Any turn number smaller than $N_{total}$ is then associated with a different magnetic position of the skyrmions 20A, 20B in the transfer patterns 28A, 28B and thus with a unique binary state and a unique output state of the device 200.

It is to be noted that a full rotation of the component may not necessarily correspond to a full rotation of the magnetic field 22. A ratio between the rotation number of the component and a rotation number of the magnetic field 22 may be chosen arbitrarily, for example by suitably adjusting a transmission ratio. It is further to be noted that the number of transfer patterns and the number of positions in the transfer patterns may be chosen according to the number of rotations that shall be detectable by the device 200. In one example, a single transfer pattern may suffice to distinguish all possible rotation numbers while further applications may require two or more transfer patterns.

The device 300 of FIG. 3 may include some or all features of previously discussed devices. FIG. 3 only shows a partial view of the device 300. It is understood that the device 300 may include further elements similar to FIG. 1. In the illustrated example, one or multiple of the magnetoresistive elements 6 of the device 300 may include a further free layer 40. The further free layer 40 may be arranged between the magnetic layer 2 and the intermediate layer 12.

The further free layer 40 may be sensitive to magnetic fields in a direction perpendicular to the further free layer 40, e.g., in the z-direction. For example, such sensitivity may be provided using a multidomain perpendicular structure. In this regard, a large number of domains and low hysteresis may be provided by using a magnetic structure with Dzyaloshinskii-Moriya interaction (DMI). Alternatively, or additionally, a magnetic structure may be used in which the magnetization may be basically in-plane due to shape anisotropy. Out of plane magnetic fields may tilt out the magnetization towards the perpendicular direction.

In the previously discussed example of FIG. 1, fabrication of the layer stacks in the magnetoresistive elements 6 may include an etching step that may need to be stopped in a controlled manner on the magnetic layer 2. This may represent a challenging technical task. In the example of FIG. 3, the challenging task of appropriately stopping the etching process may be relaxed due to usage of the further free layer 40. The further free layer 40 may be not necessarily deposited directly on the magnetic layer 2, but may be separated by a non-magnetic layer (not illustrated). In contrast to the magnetic layer 2, the further free layer 40 may have a defined thickness such that an etching process may be stopped on the magnetic layer 2 or the non-magnetic layer in a controlled manner.

It is to be noted that a TMR junction including a further free layer 40 may not necessarily be configured to generate (or write) a skyrmion in the magnetic layer 2. In this case, skyrmions may be generated or written using a conductive loop (or current loop) as discussed in connection with FIG. 1. Optionally, the device 300 may further include a conductive layer (not illustrated) arranged between the further free layer 40 and the magnetic layer 2 that may be used for making a connection to a bottom contact 18.

Figure 4:
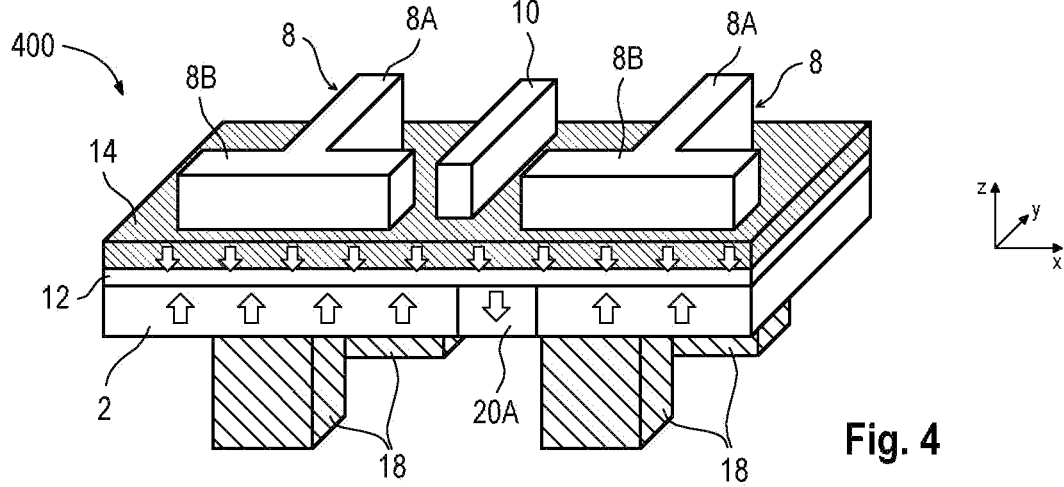
FIG. 4 schematically illustrates a perspective view of a device 400 in accordance with the disclosure.

The device 400 of FIG. 4 may include some or all features of previously discussed devices. FIG. 4 only shows a partial view of the device 400. It is understood that the device 400 may include further elements similar to FIG. 1. In contrast to previously discussed devices, the device 400 may include one or multiple magnetoresistive elements 6 corresponding to current-in-plane (CIP) magnetoresistive elements. Here, currents may flow in a lateral direction, e.g., in the x-y-plane. The device 400 may thus not necessarily include top contacts as e.g., shown in the example of FIG. 1A. Rather, the magnetoresistive elements 6 of the device 400 may be connected with at least two bottom contacts 18.

In one example, the intermediate layer 12 may be a spacer layer and the magnetoresistive element 6 may correspond to a giant magnetoresistive (GMR) element. For example, a spacer layer may include or may be made of copper. In a further example, the intermediate layer 12 may be a tunnel barrier layer and the magnetoresistive element 6 may correspond to a tunnel magnetoresistive (TMR) element. For example, the tunnel barrier layer may include or may be made of magnesium oxide (MgO). When manufacturing the magnetoresistive elements 6 of the device 400 no structuring of tunnel magnetoresistive pillars may be necessary. That is, no technically challenging etching step as discussed in connection with FIG. 1 may be required for the fabrication of the device 400.

An operation of the device 400 may be at least partially similar to an operation of previously discussed devices. A skyrmion 20A may be sequentially transferred in the magnetic layer 2 along a transfer pattern in response to a rotating magnetic field. Depending on the whether the skyrmion 20A is present in a current path between the bottom electrodes 18, a resistivity may be high or low. Similar to FIG. 2 a unique binary state associated with the position of the skyrmion 20A in the transfer pattern may be determined based on a measurement of the magnetoresistive elements 6 of the device 400. An output state associated with the binary state may then be readout and a number of rotations of the rotating magnetic field may be determined.

Figure 5A:
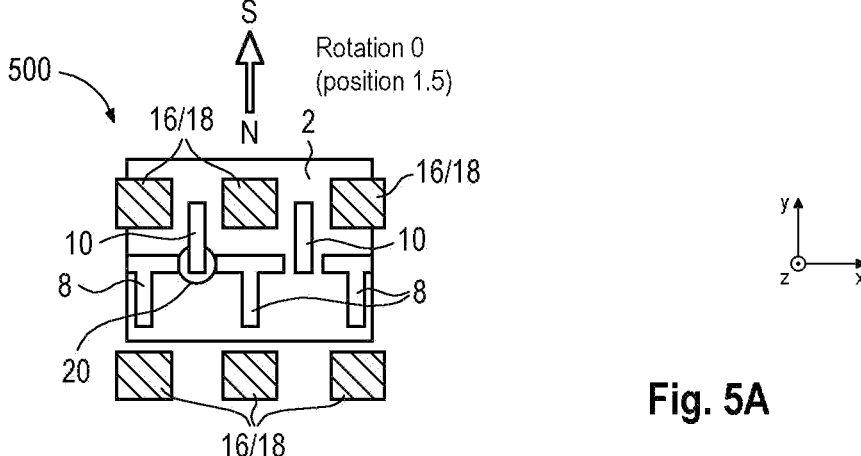
FIGS. 5A to 5C schematically illustrate an operation of a device 500 in accordance with the disclosure.
Figure 5B:
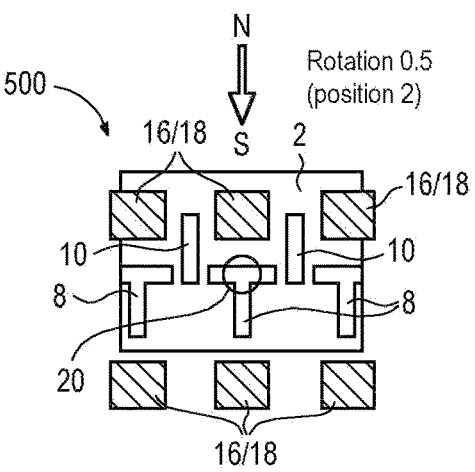
Figure 5B:
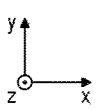
Figure 5C:
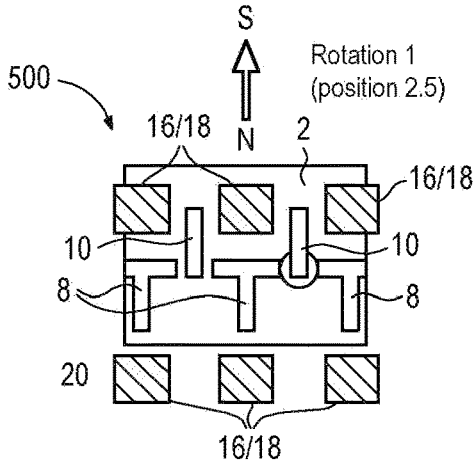
Figure 5C:
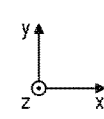

FIG. 5 includes FIGS. 5A to 5C illustrating an operation of a device 500 in accordance with the disclosure. The device 500 may include some or all features of previously discussed devices. The device 500 may include magnetoresistive elements positioned at each T-shaped component 8 and at each I-shaped component 10 of the guiding structure. For the sake of simplicity, the magnetoresistive elements are only indicated by electrical contacts 16/18. The electrical contacts 16/18 may be top contacts and/or bottom contacts depending on the design of the magnetoresistive elements.

In FIG. 5A, a magnetic field 22 may point in the positive y-direction, and a skyrmion 20 may be located under an I-shaped component 10. In FIG. 5B, after a rotation of 180 degrees, the magnetic field 22 may point in the negative y-direction. The skyrmion 20 may then be located under a T-shaped component 8. In FIG. 5C, after a further rotation of 180 degrees, the magnetic field 22 may again point in the positive y-direction. The skyrmion 20 may now be located under the next I-shaped component 10. As can be seen from the illustrated example, the skyrmion 20 may be detected at least with a resolution of half a rotation of the magnetic field 22. In contrast to this, an operation only taking into account measured values of the T-shaped components 8 may merely provide a resolution of full rotations of the magnetic field 22.

Figure 6A:
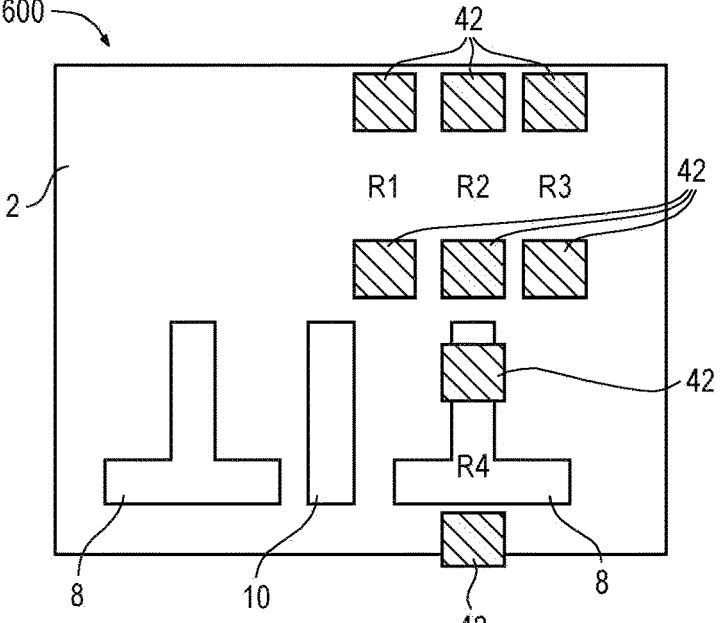
Figure 6A:

FIG. 6 includes FIGS. 6A and 6B schematically illustrating a device 600 in accordance with the disclosure and a Wheatstone bridge circuit that may be used in the device 600. The device 600 may include some or all features of previously discussed devices. Each T-shaped component 8 and I-shaped component 10 of the guiding structure may include a magnetoresistive element for detecting the position of a skyrmion. In the illustrated example, a magnetoresistive element for reading out the position of a skyrmion may include or may be realized using a Wheatstone bridge circuit. For the sake of simplicity, FIG. 6A only shows electrical contacts 42 of a Wheatstone bridge circuit associated with the T-shaped structure 8 on the right. For example, the associated magnetoresistive element may correspond to a giant magnetoresistive (GMR) element. It is understood that a Wheatstone bridge circuit may be used in a similar fashion for a TMR design of the magnetoresistive element.

A structure of a Wheatstone bridge circuit is exemplarily shown in FIG. 6B. The Wheatstone bridge circuit may include a voltage supply (see V), four resistances (see $R_1$ to $R_4$) and a galvanometer G. Resistances $R_1$ to $R_3$ may be known while resistance $R_4$ may be a resistance to be measured. Resistance $R_2$ may be adjustable. Adjustable resistance $R_2$ may be adjusted until the bridge is balanced and no current flows through the galvanometer G. At the point of balance resistance $R_4$ may be determined. In this regard, it may be important to bring the sensor signal close to zero and compensate for temperature effects.

Devices in accordance with the disclosure may provide the following technical effects and on this basis outperform conventional devices.

Components of devices described herein may be integrated in a single semiconductor chip. In particular, the magnetic layer, the guiding structure and the plurality of magnetoresistive elements may be integrated in a single semiconductor chip. In this regard, a fabrication of device components may be based on CMOS technology, e.g., the fabrication may be CMOS compatible. For example, at least one of the intermediate layer, the reference layer or the further free layer may be manufactured based on a sputtering technique.

Due to their small dimensions a plurality of transfer patterns can be used in the devices described herein such that a large number of rotations of the magnetic field may be distinguished.

Readout of a calibrated output state from a device in accordance with the disclosure may be performed at any time. The counting functionality of the device does not have to be interrupted for a readout operation. A static readout performed by multiple magnetoresistive elements may be provided.

The direction of the sequential transfer of the skyrmions along the transfer patterns may be associated with the rotational direction of the rotating magnetic field. Devices in accordance with the disclosure may thus provide a counting functionality which is inherently directional.

Transferring a skyrmion in the magnetic layer along a transfer pattern may be independent of any power supply (or electrical power supply). A transfer of the skyrmion may be effected exclusively by the rotating magnetic field and the magnetization of the guiding structure generated by it. The discussed process of determining a rotation number may thus not require any additional power supply.

Using skyrmions may provide a non-volatility of the information about the rotational movement. Counting may still be performed in case of an electric power failure or cut-off. No information is lost and readout may be performed after reconnecting the device to electrical power.

FIG. 7 illustrates a flowchart of a method for fabricating a device in accordance with the disclosure. The method may be used for fabricating any of the previously discussed devices and may thus be read in connection with the foregoing figures. The method of FIG. 7 is described in a general manner in order to qualitatively specify aspects of the disclosure. It is understood that the method may be extended by any of the aspects described in connection with other examples in accordance with the disclosure.

At 44, a magnetic layer may be provided. At 46, a guiding structure is arranged over the magnetic layer. The guiding structure may be configured to sequentially transfer a skyrmion in the magnetic layer along a transfer pattern in response to a rotating magnetic field. At 48, a plurality of magnetoresistive elements may be arranged along the transfer pattern. The magnetoresistive elements may be configured to detect a position of the skyrmion in the transfer pattern. The fabricated device may be configured to determine a number of rotations of the rotating magnetic field based on the detected position of the skyrmion in the transfer pattern.

Aspects

In the following, devices for determining a number of rotations of a magnetic field as well as methods for fabricating such devices will be explained using aspects.

Aspect 1 is a device, comprising: a magnetic layer; a guiding structure arranged over the magnetic layer and configured to sequentially transfer a skyrmion in the magnetic layer along a transfer pattern in response to a rotating magnetic field; and a plurality of magnetoresistive elements arranged along the transfer pattern and configured to detect a position of the skyrmion in the transfer pattern, wherein the device is configured to determine a number of rotations of the rotating magnetic field based on the detected position of the skyrmion in the transfer pattern.

Aspect 2 is a device according to Aspect 1, wherein: a transfer of the skyrmion in the magnetic layer along the transfer pattern is effected by a magnetization of the guiding structure, and the magnetization of the guiding structure is generated by the rotating magnetic field.

Aspect 3 is a device according to Aspect 1 or 2, wherein the transfer of the skyrmion in the magnetic layer along the transfer pattern is independent of any power supply.

Aspect 4 is a device according to one of the preceding Aspects, wherein the guiding structure comprises: a plurality of T-shaped soft magnetic components, and a plurality of I-shaped soft magnetic components, wherein the T-shaped components and the I-shaped components are arranged alternately.

Aspect 5 is a device according to one of the preceding Aspects, wherein the transfer pattern forms a closed loop.

Aspect 6 is a device according to one of the preceding Aspects, wherein: during N1 consecutive rotations of the rotating magnetic field, the skyrmion is sequentially transferred along N1 positions on the transfer pattern, and after the N1 consecutive rotations of the rotating magnetic field, the skyrmion again reaches a same position on the transfer pattern, wherein N1 is a first integer.

Aspect 7 is a device according to Aspect 6, wherein: N1 magnetoresistive elements of the plurality of magnetoresistive elements are arranged at the N1 positions, respectively, and the device is configured to determine the number of rotations of the rotating magnetic field based on N1 measurement values provided by the N1 magnetoresistive elements.

Aspect 8 is a device according to one of the preceding Aspects, wherein a magnetoresistive element of the plurality of magnetoresistive elements comprises: a free layer, wherein the free layer is at least partially formed by the magnetic layer, an intermediate layer arranged over the magnetic layer, wherein the intermediate layer comprises a spacer layer or a tunnel barrier layer, and a reference layer arranged over the intermediate layer.

Aspect 9 is a device according to Aspect 8, wherein the magnetoresistive element of the plurality of magnetoresistive elements further comprises: a further free layer arranged between the magnetic layer and the intermediate layer, wherein the further free layer is sensitive to magnetic fields in a direction perpendicular to the further free layer.

Aspect 10 is a device according to Aspect 9, wherein at least one of the intermediate layer, the reference layer or the further free layer comprises a sputtered film.

Aspect 11 is a device according to one of the preceding Aspects, wherein the magnetic layer, the guiding structure and the plurality of magnetoresistive elements are integrated in a single semiconductor chip.

Aspect 12 is a device according to one of Aspects 4 to 11, wherein a magnetoresistive element is arranged at each T-shaped component.

Aspect 13 is a device according to one of Aspects 4 to 11, wherein a first respective magnetoresistive element is arranged at each T-shaped component and a second respective magnetoresistive element is arranged at each I-shaped component.

Aspect 14 is a device according to one of the preceding Aspects, wherein: the device is configured to generate a bias magnetic field in a direction perpendicular to the magnetic layer, and a magnetization of the skyrmion is anti-parallel to a direction of the bias magnetic field.

Aspect 15 is a device according to one of the preceding Aspects, further comprising: a component configured to generate the skyrmion and to feed the skyrmion into the transfer pattern, wherein the component comprises at least one of a magnetoresistive element or a conductive loop.

Aspect 16 is a device according to one of the preceding Aspects, wherein the device is configured to remove one or multiple skyrmions from the magnetic layer based on a spin orbit torque effect.

Aspect 17 is a device according to one of the preceding Aspects, wherein the magnetic layer and a rotation plane of the magnetic field are arranged parallel to each other.

Aspect 18 is a device according to one of Aspects 7 to 17, further comprising: a further guiding structure configured to sequentially transfer a further skyrmion in the magnetic layer along a further transfer pattern in response to the rotating magnetic field; a further plurality of magnetoresistive elements arranged along the further transfer pattern and configured to detect a position of the further skyrmion in the further transfer pattern, wherein the device is configured to determine the number of rotations of the rotating magnetic field based on the detected position of the further skyrmion in the further transfer pattern.

Aspect 19 is a device according to Aspect 18, wherein: the further transfer pattern forms a further closed loop, during N2 consecutive rotations of the rotating magnetic field, the further skyrmion is sequentially transferred along N2 positions on the further closed loop, after the N2 consecutive rotations of the rotating magnetic field, the further skyrmion again reaches a same position on the further closed loop, and wherein N2 is a second integer and N1 and N2 are coprime numbers.

Aspect 20 is a device according to one of the preceding Aspects, wherein each magnetoresistive element of the plurality of magnetoresistive elements is connected with a top contact and a bottom contact.

Aspect 21 is a device according to one of the preceding Aspects, wherein each magnetoresistive element of the plurality of magnetoresistive elements is connected with two bottom contacts.

Aspect 22 is a method for fabricating a device, wherein the method comprises: providing a magnetic layer; arranging a guiding structure over the magnetic layer, wherein the guiding structure is configured to sequentially transfer a skyrmion in the magnetic layer along a transfer pattern in response to a rotating magnetic field; and arranging a plurality of magnetoresistive elements along the transfer pattern, wherein the magnetoresistive elements are configured to detect a position of the skyrmion in the transfer pattern, wherein the fabricated device is configured to determine a number of rotations of the rotating magnetic field based on the detected position of the skyrmion in the transfer pattern.

While the present disclosure has been described with reference to illustrative aspects, this description is not intended to be construed in a limiting sense. Various modifications and combinations of the illustrative aspects, as well as other aspects of the disclosure, will be apparent to persons skilled in the art upon reference of the description. It is therefore intended that the appended claims encompass any such modifications or implementations.

The invention claimed is:

1. A device, comprising:
a magnetic layer;
a guiding structure arranged over the magnetic layer and configured to sequentially transfer a skyrmion in the magnetic layer along a transfer pattern in response to a rotating magnetic field; and
a plurality of magnetoresistive elements arranged along the transfer pattern and configured to detect a position of the skyrmion in the transfer pattern,
wherein the device is configured to determine a number of rotations of the rotating magnetic field based on the position of the skyrmion in the transfer pattern.

2. The device of claim 1, wherein:
a transfer of the skyrmion in the magnetic layer along the transfer pattern is effected by a magnetization of the guiding structure, and
the magnetization of the guiding structure is generated by the rotating magnetic field.

3. The device of claim 1, wherein a transfer of the skyrmion in the magnetic layer along the transfer pattern is independent of any power supply.

4. The device of claim 1, wherein the guiding structure comprises:
a plurality of T-shaped soft magnetic components, and
a plurality of I-shaped soft magnetic components, wherein the T-shaped components and the I-shaped components are arranged alternately.

5. The device of claim 4, wherein a magnetoresistive element is arranged at each T-shaped component.

6. The device of claim 4, wherein a first respective magnetoresistive element is arranged at each T-shaped component and a second respective magnetoresistive element is arranged at each I-shaped component.

7. The device of claim 1, wherein the transfer pattern forms a closed loop.

8. The device of claim 1, wherein:
during N1 consecutive rotations of the rotating magnetic field, the skyrmion is sequentially transferred along N1 positions on the transfer pattern, wherein N1 is a first integer, and
after the N1 consecutive rotations of the rotating magnetic field, the skyrmion again reaches a same position on the transfer pattern.

9. The device of claim 8, wherein:
N1 magnetoresistive elements of the plurality of magnetoresistive elements are arranged at the N1 positions, respectively, and
the device is configured to determine the number of rotations of the rotating magnetic field based on N1 measurement values provided by the N1 magnetoresistive elements.

10. The device of claim 9, further comprising:
a further guiding structure configured to sequentially transfer a further skyrmion in the magnetic layer along a further transfer pattern in response to the rotating magnetic field;

a further plurality of magnetoresistive elements arranged along the further transfer pattern and configured to detect a position of the further skyrmion in the further transfer pattern, wherein the device is configured to determine the number of rotations of the rotating magnetic field based on the position of the further skyrmion in the further transfer pattern.

11. The device of claim 10, wherein:

the further transfer pattern forms a further closed loop, during N2 consecutive rotations of the rotating magnetic field, the further skyrmion is sequentially transferred along N2 positions on the further closed loop, wherein N2 is a second integer, after the N2 consecutive rotations of the rotating magnetic field, the further skyrmion again reaches a same position on the further closed loop, and N1 and N2 are coprime numbers.

12. The device of claim 1, wherein a magnetoresistive element of the plurality of magnetoresistive elements comprises:

a free layer, wherein the free layer is at least partially formed by the magnetic layer, an intermediate layer arranged over the magnetic layer, wherein the intermediate layer comprises a spacer layer or a tunnel barrier layer, and a reference layer arranged over the intermediate layer.

13. The device of claim 12, wherein the magnetoresistive element of the plurality of magnetoresistive elements further comprises:

a further free layer arranged between the magnetic layer and the intermediate layer, wherein the further free layer is sensitive to magnetic fields in a direction perpendicular to the further free layer.

14. The device of claim 13, wherein at least one of the intermediate layer, the reference layer, or the further free layer comprises a sputtered film.

15. The device of claim 1, wherein the magnetic layer, the guiding structure, and the plurality of magnetoresistive elements are integrated in a single semiconductor chip.

16. The device of claim 1, wherein:

the device is configured to generate a bias magnetic field in a direction perpendicular to the magnetic layer, and a magnetization of the skyrmion is anti-parallel to a direction of the bias magnetic field.

17. The device of claim 1, further comprising:

a component configured to generate the skyrmion and feed the skyrmion into the transfer pattern, wherein the component comprises at least one of a magnetoresistive element or a conductive loop.

18. The device of claim 1, wherein the device is configured to remove one or multiple skyrmions from the magnetic layer based on a spin orbit torque effect.

19. The device of claim 1, wherein the magnetic layer and a rotation plane of the magnetic field are arranged parallel to each other.

20. The device of claim 1, wherein each magnetoresistive element of the plurality of magnetoresistive elements is connected with a top contact and a bottom contact.

21. The device of claim 1, wherein each magnetoresistive element of the plurality of magnetoresistive elements is connected with two bottom contacts.

22. A method for fabricating a device, wherein the method comprises:

providing a magnetic layer;

arranging a guiding structure over the magnetic layer, wherein the guiding structure is configured to sequentially transfer a skyrmion in the magnetic layer along a transfer pattern in response to a rotating magnetic field; and arranging a plurality of magnetoresistive elements along the transfer pattern, wherein the magnetoresistive elements are configured to detect a position of the skyrmion in the transfer pattern, wherein the fabricated device is configured to determine a number of rotations of the rotating magnetic field based on the position of the skyrmion in the transfer pattern.

\* \* \* \* \*